US011662442B2

(12) United States Patent
Ueno et al.

(10) Patent No.: US 11,662,442 B2
(45) Date of Patent: May 30, 2023

(54) DISTANCE MEASUREMENT APPARATUS WITH DETECTION TIMING CORRECTION

(71) Applicant: DENSO CORPORATION, Kariya (JP)

(72) Inventors: Akifumi Ueno, Kariya (JP); Takehiro Hata, Kariya (JP); Shinji Kashiwada, Kariya (JP)

(73) Assignee: DENSO CORPORATION, Kariya (JP)

( * ) Notice: Subject to any disclaimer, the term of this patent is extended or adjusted under 35 U.S.C. 154(b) by 631 days.

(21) Appl. No.: 16/720,553

(22) Filed: Dec. 19, 2019

(65) Prior Publication Data

US 2020/0132817 A1 Apr. 30, 2020

Related U.S. Application Data

(63) Continuation of application No. PCT/JP2018/023817, filed on Jun. 22, 2018.

(30) Foreign Application Priority Data

Jun. 22, 2017 (JP) .............................. JP2017-122287
Jun. 11, 2018 (JP) .............................. JP2018-111123

(51) Int. Cl.
*G01S 7/4861* (2020.01)
*G01S 17/08* (2006.01)
(Continued)

(52) U.S. Cl.
CPC ............ *G01S 7/4861* (2013.01); *G01S 7/497* (2013.01); *G01S 17/08* (2013.01); *G01S 17/89* (2013.01); *H01L 31/02027* (2013.01)

(58) Field of Classification Search
CPC ........ G01S 7/4861; G01S 7/497; G01S 17/08; G01S 17/89; G01S 17/14; G01S 7/7865; H01L 31/02027
See application file for complete search history.

(56) References Cited

U.S. PATENT DOCUMENTS

2014/0103196 A1 4/2014 Soga et al.
2018/0259629 A1* 9/2018 Oohata ................... G01S 17/10

FOREIGN PATENT DOCUMENTS

JP 2014-081253 A1 5/2014
JP 2014-081254 A1 5/2014
(Continued)

*Primary Examiner* — Jennifer D Bennett
(74) *Attorney, Agent, or Firm* — Maschoff Brennan

(57) ABSTRACT

An optical distance measurement apparatus that measures a distance using a round-trip time of light to an object includes an irradiator, a plurality of SPADs, a plurality of signal output units, a response number detector, a timing identifier, and a timing corrector. The response number detector detects a response number representing the number of responding one of the SPADs based on a pulse signal. The timing identifier identifies a temporary timing based on a state of variation in the response number along a time series and identifies a detection timing representing a timing when the optical distance measurement apparatus detects light in accordance with the temporary timing. The timing corrector acquires a correction time representing a time difference between the temporary timing and a true timing corresponding to a distance to an object and sets a timing corrected from the temporary timing by the correction time as the detection timing.

12 Claims, 14 Drawing Sheets

(51) Int. Cl.
    *H01L 31/02*     (2006.01)
    *G01S 7/497*     (2006.01)
    *G01S 17/89*     (2020.01)

(56) References Cited

FOREIGN PATENT DOCUMENTS

| | | | |
|---|---|---|---|
| JP | 2016-151458 A | | 8/2016 |
| JP | 2016176750 A | * | 10/2016 |
| JP | 2018-091760 A | | 6/2018 |
| JP | 2018-182051 A | | 11/2018 |
| WO | 2017/042993 A1 | | 3/2017 |

* cited by examiner

FIG.16
FIRST RESPONSE 
SECOND RESPONSE 
THIRD RESPONSE 
ACCUMULATION 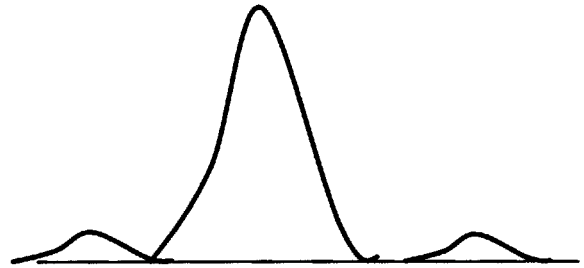
DIVIDED BY THE NUMBER OF TIMES OF ACCUMULATION 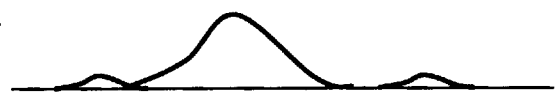

US 11,662,442 B2

DISTANCE MEASUREMENT APPARATUS WITH DETECTION TIMING CORRECTION

CROSS-REFERENCE TO RELATED APPLICATION

This application is the U.S. bypass application of International Application No. PCT/JP2018/023817 filed Jun. 22, 2018 which designated the U.S. and claims priority to Japanese Patent Applications No. 2017-122287, filed Jun. 22, 2017, and No. 2018-111123, filed Jun. 11, 2018, the contents of which are incorporated herein by reference.

TECHNICAL FIELD

The disclosure relates to a technology for an optical distance measurement apparatus that measures a distance using a round-trip time of light to an object, the technology using SPADs for detection of the light.

BACKGROUND

JP 2014-081253 A suggests a technology of detecting whether or not a plurality of SPADs respond in synchronization with a clock for detection of light entering the SPADs. According to the technology of JP 2014-081253 A, the number of the responding SPADs (hereinafter referred to as a response number of the SPADs) is detected in synchronization with the clock, and the response number of the SPADs is assumed to increase with an increase in an intensity of light.

SUMMARY

An optical distance measurement apparatus according to an aspect of the disclosure includes an irradiator, a plurality of SPADs, a plurality of signal output units, a response number detector, a timing identifier, and a timing corrector.

The irradiator is configured to irradiate light waves to a region where an object is to be detected. The plurality of SPADs are each configured to respond to incidence of a photon including a reflected wave of the light waves. The plurality of signal output units, which correspond one-to-one to the plurality of SPADs, are each configured to output a pulse signal every time when corresponding one of the SPADs responds. The response number detector is configured to detect a response number based on the pulse signal, the response number representing the number of responding one of the SPADs.

The timing identifier is configured to identify a temporary timing based on a state of variation in the response number along a time series and identify a detection timing in accordance with the temporary timing, the detection timing representing a timing when the optical distance measurement apparatus detects light. The timing corrector is configured to acquire a correction time representing a time difference between the temporary timing and a true timing corresponding to a distance to the object and set a timing corrected from the temporary timing by the correction time as the detection timing.

BRIEF DESCRIPTION OF THE DRAWINGS

FIG. 16 is a graph showing an example of a process for accumulating response numbers of the SPADs resulting from a plurality of times of light waves irradiation.

DETAILED DESCRIPTION OF THE PREFERRED EMBODIMENTS

Figure 1:
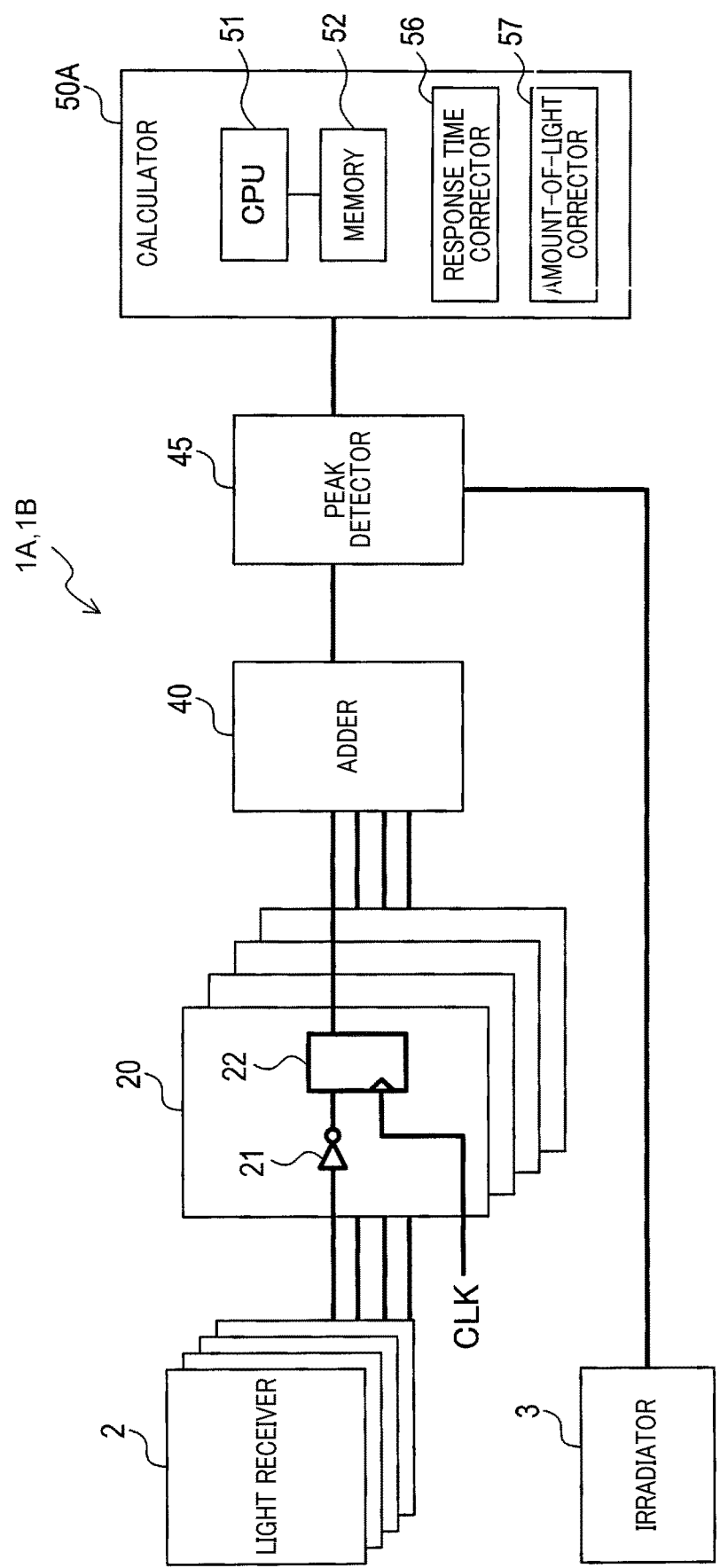
FIG. 1 is a block diagram showing a configuration of an optical distance measurement apparatus according to a first embodiment.

According to the technology of JP 2014-081253 A, a delay tends to occur with respect to an actual timing, which corresponds to a distance to an object, in proportion to a reduction in the number of responding ones of the plurality of SPADs and an increase in a time period when the SPADs are responding, that is, a time period when the SPADs are outputting pulses.

As a result of a detailed study by the inventors, it has been found that the technology of JP 2014-081253 A is unlikely to enable accurate estimation of a timing when light is detected from the number of responses of the SPADs.

According to an aspect of the disclosure, it is intended to provide a technology for an optical distance measurement apparatus that detects light with use of SPADs, the technology enabling accurate estimation of a timing when the SPADs detect the light.

An optical distance measurement apparatus according to an aspect of the disclosure includes an irradiator, a plurality of SPADs, a plurality of signal output units, a response number detector, a timing identifier, and a timing corrector.

The irradiator is configured to irradiate light waves to a region where an object is to be detected. The plurality of SPADs are each configured to respond to incidence of a photon including a reflected wave of the light waves. The plurality of signal output units, which correspond one-to-one to the plurality of SPADs, are each configured to output a pulse signal every time when corresponding one of the SPADs responds. The response number detector is configured to detect a response number based on the pulse signal, the response number representing the number of responding one of the SPADs.

The timing identifier is configured to identify a temporary timing based on a state of variation in the response number along a time series and identify a detection timing in accordance with the temporary timing, the detection timing representing a timing when the optical distance measurement apparatus detects light. The timing corrector is configured to acquire a correction time representing a time difference between the temporary timing and a true timing corresponding to a distance to the object and set a timing corrected from the temporary timing by the correction time as the detection timing.

Such an optical distance measurement apparatus, which identifies a timing obtained by correcting the temporary timing by the correction time as the detection timing, allows for correcting a time difference between the true timing, which corresponds to the distance to the object, and the temporary timing. Consequently, it is possible to accurately estimate the timing when the SPADs detect the light.

Embodiments of the disclosure will be described below with reference to the drawings.

1. First Embodiment 1-1. Configuration

An optical distance measurement apparatus 1A shown in FIG. 1, which is an apparatus that measures a distance using a round-trip time of light to an object, includes a light detector that detects light with use of an avalanche photodiode (hereinafter, APD), especially SPAD. The optical distance measurement apparatus 1A has a function to identify the distance to the object by, for example, outputting a signal light such as a laser lidar and identifying a timing when a reflected light is received relative to a timing when the signal light is outputted with use of the light detector.

It should be noted that a SPAD is an abbreviation of single photon avalanche diode. A SPAD is caused to operate by application of a voltage higher than a break-down voltage, i.e., a reverse bias voltage. Breakdown of a SPAD is caused by incidence of a photon. Accordingly, such a type of light detector is typically configured to detect a voltage variation responsive to breakdown of a SPAD and output a digital pulse (hereinafter, pulse signal) with a predetermined pulse width.

As shown in FIG. 1, the optical distance measurement apparatus 1A includes an irradiator 3, a plurality of light receivers 2, and a plurality of level detection circuits 20. Additionally, the optical distance measurement apparatus 1A may also include an adder 40, a peak detector 45, and a calculator 50A. At least the plurality of light receivers 2 and the plurality of level detection circuits 20 in the optical distance measurement apparatus 1A constitute a light detector that detects light. In the embodiment, a part of the adder 40 and the peak detector 45 also constitutes the light detector.

The irradiator 3, which includes, for example, a laser diode that functions as a light source, irradiates light waves from the light source to a region where an object, which is a target for distance measurement, is to be detected. For example, the irradiator 3 irradiates the light waves every cycle, such as every 100 ms, set in accordance with a later-described clock, allowing a reflected wave to be received by the light detector.

Figure 2:
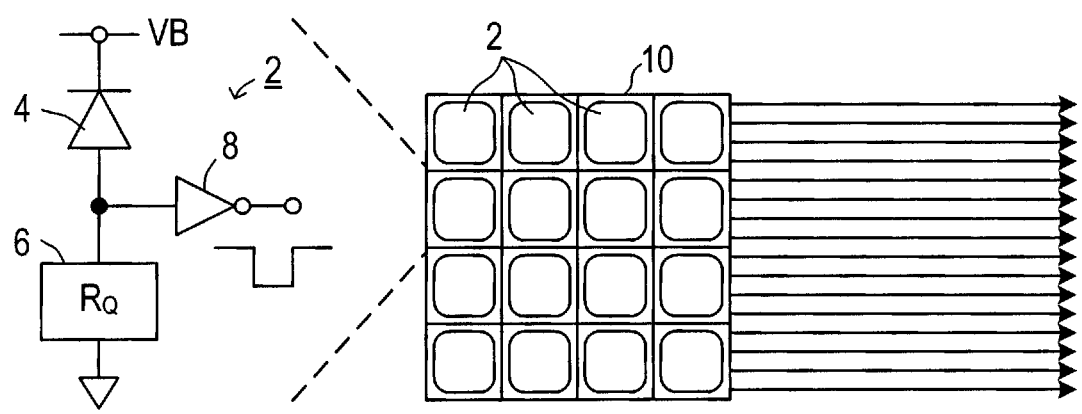
FIG. 2 is an illustration showing the configuration of the optical distance measurement apparatus.

As shown in FIG. 2, the plurality of light receivers 2 are arranged in a lattice pattern along longitudinal and lateral directions, constituting a light receiver array 10 that constitutes one pixel for light detection. The light receivers 2 are each configured to output a pulse signal in response to incidence of a photon. As shown in FIG. 2, the light receivers 2 each include a SPAD 4 and a quench resistance 6, and a pulse output unit 8.

The SPAD 4 has a cathode connected to a reverse bias voltage VB and an anode connected to the quench resistance 6 and the pulse output unit 8. The quench resistance 6 is connected to an energizing path to the SPAD 4 in series.

The quench resistance 6 not only applies the reverse bias voltage VB to the SPAD 4 but also causes, when a photon is incident on the SPAD 4 and causes breakdown of the SPAD 4, a voltage drop by current passing through the SPAD 4 to stop Geiger electric discharge of the SPAD 4. It should be noted that the quench resistance 6 includes, for example, a resistance device with a predetermined resistance value or a MOSFET where an on-resistance can be set at a gate voltage.

The pulse output unit 8 is also connected to a connection point between the SPAD 4 and the quench resistance 6. The pulse output unit 8 outputs a value 1 when the breakdown of the SPAD 4 is not caused. Meanwhile, when the breakdown of the SPAD 4 is caused and current passes through the quench resistance 6 with a voltage equal to or more than a threshold voltage being caused at both ends of the quench resistance 6, the output unit 8 outputs a digital pulse representing a value 0 as the above pulse signal. In other words, the quench resistance 6 and the pulse output unit 8 are configured to output the pulse signal for each of the plurality of SPADs 4 when the corresponding SPAD 4 responds.

The level detection circuits 20, which correspond one-to-one to the light receivers 2, each have a function to detect whether or not the pulse signal from the corresponding light receiver 2 is received, that is, whether or not the corresponding SPAD 4 responds.

The level detection circuit 20 includes an inverter 21 and a clock synchronizer 22. The inverter 21 is a known inverter for a logic circuit that inverts an input and outputs the inverted input. The clock synchronizer 22 is a clock synchronous circuit that receives an input of a clock (CLK), which is a periodic pulse, and outputs an input signal value corresponding to the input of the clock every time when a clock is inputted.

The input signal value of the clock synchronizer 22 here is an output from the inverter 21. For example, the clock synchronizer 22 is, for example, a D flip-flop. The clock synchronizer 22 outputs a value inputted from the inverter 21 every time when a clock is inputted.

The adder 40 is a known adder that adds and outputs respective pulses outputted from the level detection circuits 20. The output from the adder 40 is referred to as a level value. The level value represents the response number representing the number of the light receivers 2 that output pulse signals, that is, the number of the light receivers 2 that output the value 0. The level value is thus also referred to as a value representing an intensity of the entering light.

The light receivers 2 with the above configuration output pulse signals at a frequency corresponding to an amount of ambient light. Thus, when intense light such as sunlight enters the light receivers 2, the number of the pulse signals outputted from the light receivers 2 per unit of time, i.e., pulse rate, considerably increases.

The peak detector 45 identifies a detection timing, which represents a timing when the optical distance measurement apparatus 1A detects light, by identifying a temporary timing obtained based on a state of variation in the level value along a time series. It should be noted that the detection timing is the temporary timing that has not been corrected.

Moreover, the temporary timing, which is based on a timing based on a state of variation in the response number along the time series, is a timing when such a state of variation satisfies conditions that are set in advance. Specifically, the temporary timing is a timing that is a reference for obtaining the detection timing. For example, a timing when the actual level value reaches a maximum value is used as the temporary timing in this case. It should be noted that any timing that satisfies predetermined conditions, such as a timing when a calculated level value reaches the maximum value or a timing when the level value increases to a predetermined value, may be used as the temporary timing.

Figure 4:
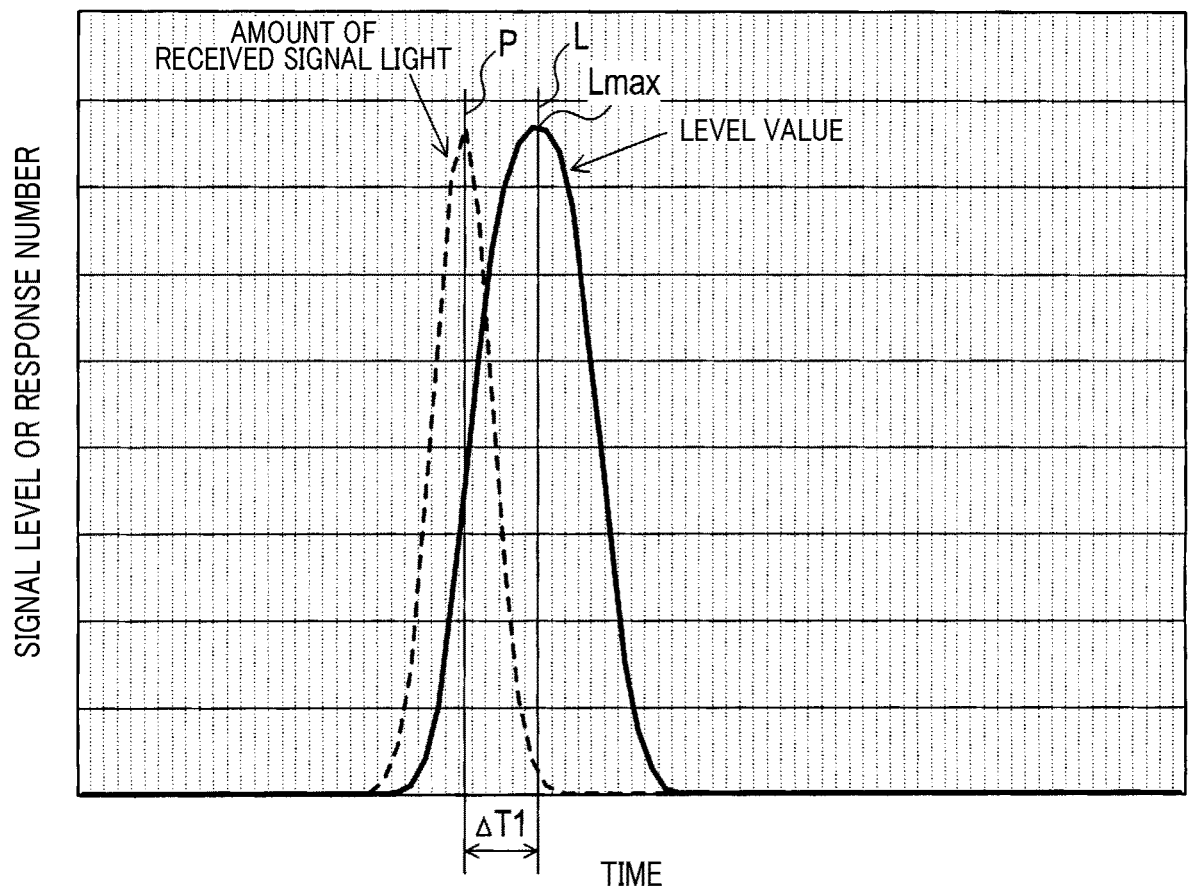
FIG. 4 is a graph showing an example of a variation with time in each of an amount of received light and a level value.

In a case of using the timing when the calculated level value reaches the maximum value, such a timing may be a timing corresponding to an intersection of a plurality of tangent lines, respective inclinations of which represent rates of change in the level value resulting from increasing and decreasing the level value to specific values. Specifically, in a graph as shown in FIG. 4 where an abscissa axis represents time series and an ordinate axis represents level value, an intersection of a plurality of tangent lines defined when the level value is a predetermined value, such as a half of the maximum value, may be obtained.

Moreover, the timing when the calculated level value reaches the maximum value may be a timing when the level value becomes a median of a plurality of timings when the level value becomes specific values. The peak detector 45 acquires an operation state of the irradiator 3, that is, light waves irradiation timing. The peak detector 45 then outputs a signal corresponding to a difference between the irradiation timing and the temporary timing. The output from the peak detector 45 is inputted to the calculator 50A.

The calculator 50A consists mainly of a known microcomputer that includes a CPU 51 and a semiconductor memory (hereinafter, memory 52) such as RAM, ROM, or flash memory. The CPU 51 executes a program stored in a non-transitory substantive recording medium, thereby implementing a variety of functions of the calculator 50A. In this example, the memory 52 corresponds to the non-transitory substantive recording medium that stores the program.

Additionally, by executing this program, a method corresponding to the program is performed. It should be noted that the non-transitory substantive recording medium means a recording medium other than electromagnetic wave. Meanwhile, the calculator 50A includes a single microcomputer or a plurality of microcomputers.

1-2. Process and Operation

As shown in FIG. 1, the calculator 50A includes a response time corrector 56 and an among-of-light corrector 57, which are components with the functions implemented when the CPU 51 executes the program. A means for implementing these elements constituting the calculator 50A is not limited to software. A part or all of the elements may be implemented by a piece of hardware or a plurality of pieces of hardware. For example, in a case where the above functions are implemented by an electronic circuit, which is an example of hardware, the electronic circuit may include a digital circuit including a lot of logic circuits or an analog circuit, or include a combination of the digital circuit and the analog circuit.

Figure 3:
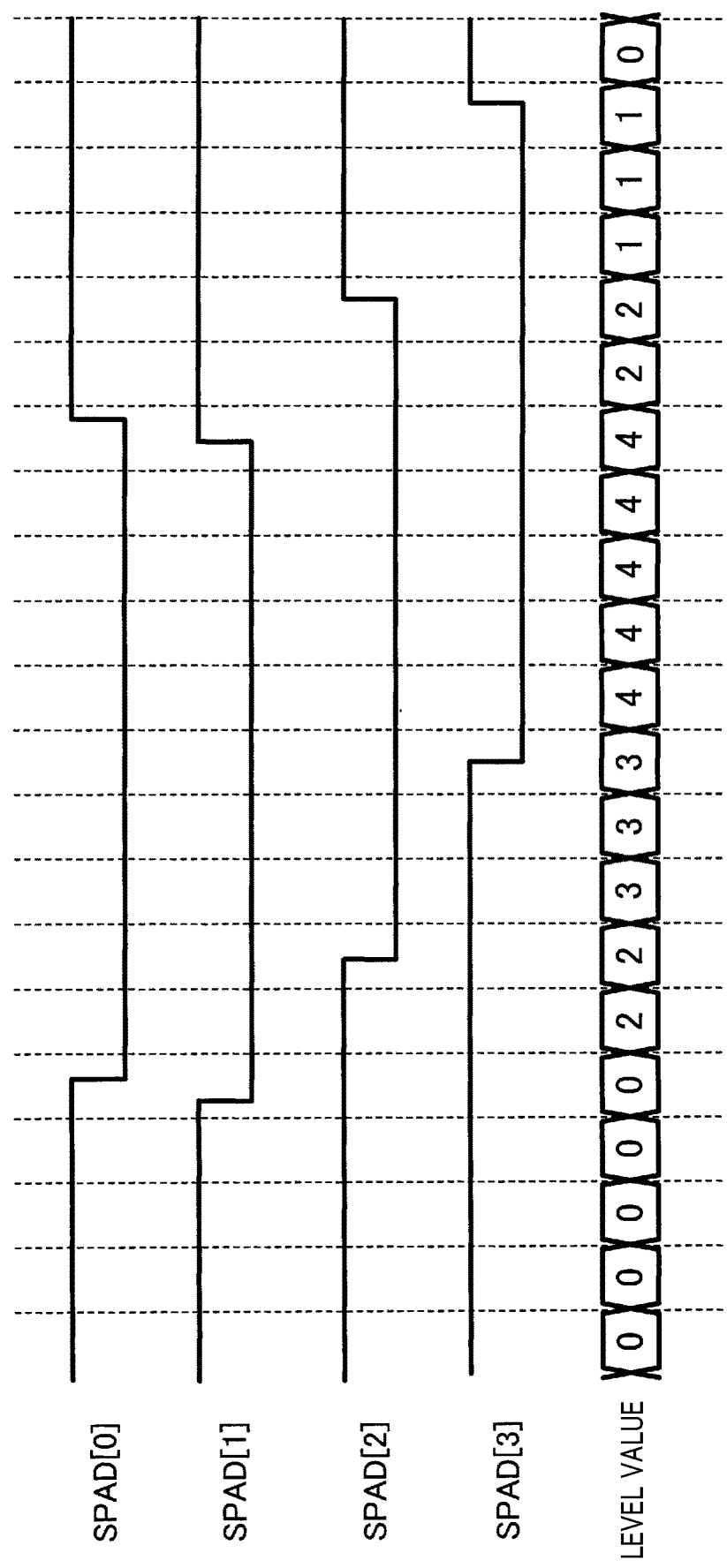
FIG. 3 is an example of an operation of an optical distance measurement apparatus model according to the first embodiment.

FIG. 3 shows an operation example of an optical distance measurement apparatus model where the number of the SPADs 4 is four. The level value reaches the maximum value at a timing when the number of the responding SPADs 4 reaches a maximum. In the example shown in FIG. 3, when a SPAD [3] responds, the level value becomes 4, which is the maximum value. It should be noted that the light receivers 2 are each denoted by SPAD [N] in FIG. 3. The N represents a number for numerically identifying one of the four light receivers 2 and is one of 0, 1, 2, and 3.

In this regard, the optical distance measurement apparatus 1A according to the embodiment has, for example, a relationship between an amount of the received signal light, that is, an amount of light entering the plurality of SPADs 4, and the level value shown in FIG. 4.

Referring to FIG. 4, the level value increases with an increase in the amount of the received signal light. It should be noted that a time difference $\Delta T1$ is caused between a true timing P when the amount of the received signal light reaches the maximum and a timing L when the level value reaches the maximum. Accordingly, to detect the timing when the light is received using the level value, it is preferable that the timing is corrected by the time difference $\Delta T1$.

It should be noted that the true timing P is a timing corresponding to the distance to the object, and is ideally a timing when the amount of the light irradiated to the optical distance measurement apparatus 1A reaches the maximum. However, since the true timing P is undetectable by the optical distance measurement apparatus 1A, a timing experimentally obtained in advance is used when using the true timing P.

In the embodiment, to identify a more accurate detection timing, the timing L when the level value reaches the maximum is corrected to approximate the timing P when the amount of the received signal light reaches the maximum by the functions of the response time corrector 56 and the amount-of-light corrector 57. In other words, the functions of the response time corrector 56 and the amount-of-light corrector 57 calculate the time difference $\Delta T1$ from the true timing P when the amount of the received light reaches the peak as a correction time for the temporary timing, i.e., the timing L when the response number reaches the peak in this case, and identify the corrected timing as the timing when the light is detected.

In detail, the response time corrector 56 corrects the temporary timing using the correction time corresponding to a length of a response duration representing a time period when the responding SPADs 4 continue to respond. In the embodiment, a predetermined fixed value is used as the correction time corresponding to the response duration.

The amount-of-light corrector 57 is configured to calculate the correction time in accordance with a light-receiving environment for the optical distance measurement apparatus 1A. Although description is made below on a configuration where the amount-of-light corrector 57 calculates the correction time with use of a map, the disclosure is not limited to this configuration. The correction time may be calculated using an expression that gives a correction time in response to a parameter representing the light-receiving environment being entered.

The amount-of-light corrector 57 in this case determines the correction time in accordance with an intensity of light among the light-receiving environment. For example, the intensity of light, which is a value representing a magnitude of an amount of the entering light, is a level of the peak of the level value or a magnitude of the rate of change in the level value (e.g., an inclination of a tangent line at a specific point in a graph of the level value in FIG. 4).

Figure 5:
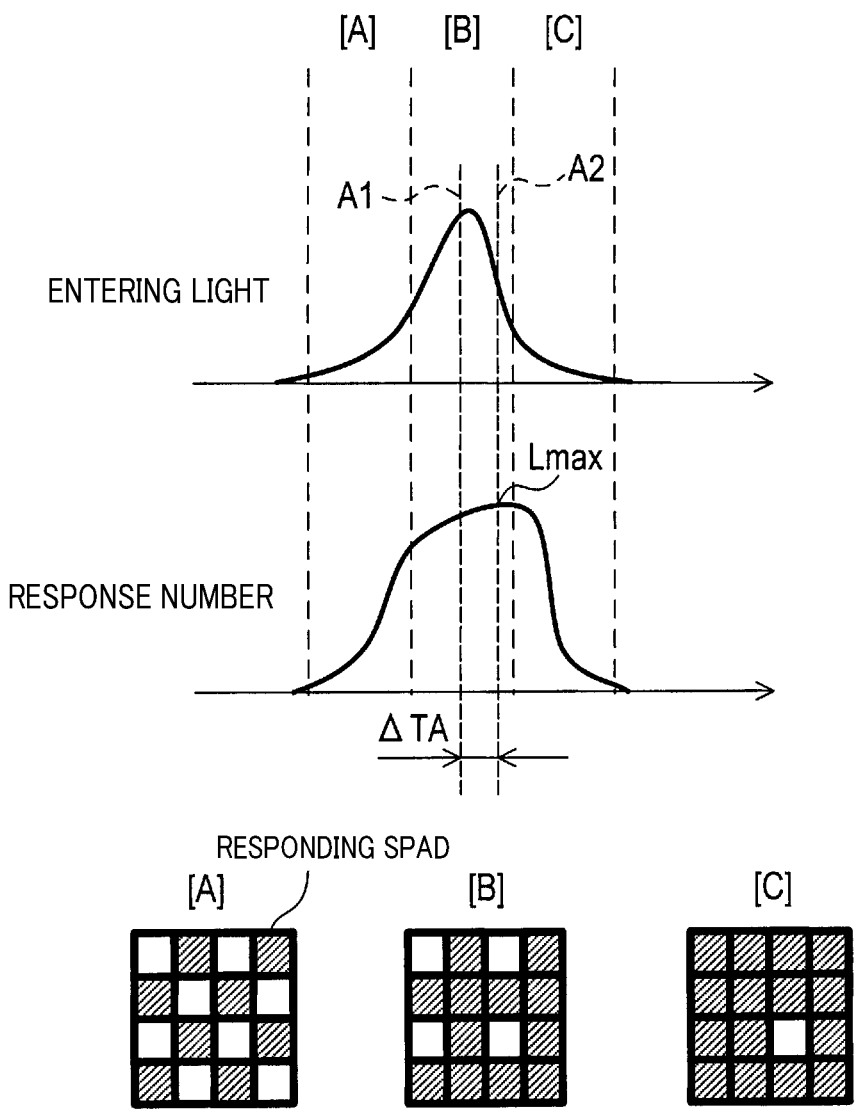
FIG. 5 is an illustration showing an example of responses from SPADs at a high intensity of light.

At a relatively high intensity of light, a time difference ΔTA between a timing A1 when the amount of the entering light reaches the peak and a timing A2 when the level value reaches a maximum value Lmax becomes relatively small as shown in FIG. 5. This is because a high intensity of light increases the amount of the entering light, causing a larger number of the SPADs 4 to respond in a relatively short time and, consequently, causing a majority of the SPADs 4 to respond by the time when the amount of the entering light reaches the peak.

Figure 6:
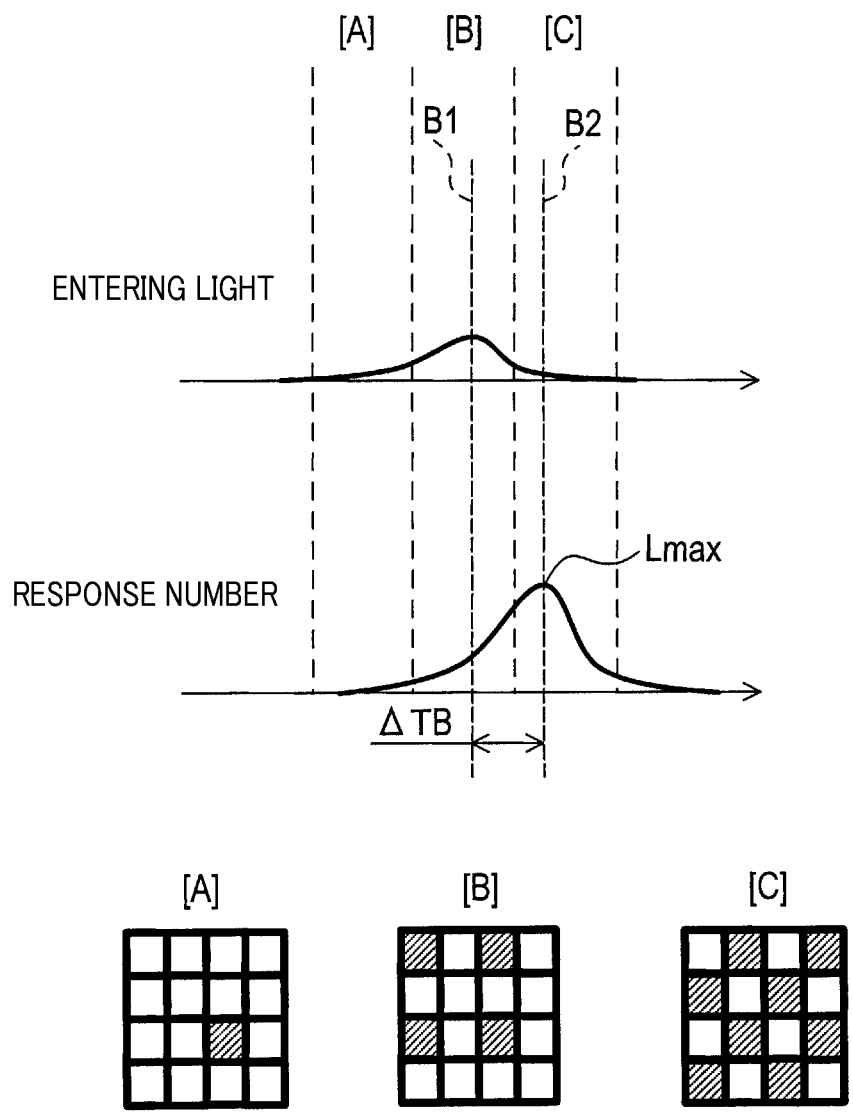
FIG. 6 is an illustration showing an example of responses from the SPADs at a low intensity of light.

Meanwhile, at a low intensity of light, a time difference ΔTB between a timing B1 when the amount of the entering light reaches the peak and a timing B2 when the level value reaches the maximum value Lmax becomes larger than the time difference ΔTA as shown in FIG. 6. This is because a low intensity of light reduces the amount of the entering light, causing the number of the responding SPADs 4 to gradually increase with an increase in the amount of the light.

In a case shown in FIG. 5 where light is intense, the response number increases by an increment of 8 during a period [A] that is an early phase of detection of light and increases by a number smaller than 8, such as 4 or 3, during a period [B] when the intensity of the light reaches the peak and a period [C] when the intensity of the light is decreasing. In a case shown in FIG. 6 where light is weak, the response number increases by an increment of 1 during the period [A] and increases by an increment larger than 1, such as 3 or 4, during the period [B] and the period [C]. In other words, in the case where the light is intense, many of the SPADs 4 respond at the early phase of detection and an increase in the response number becomes slow during the subsequent periods. This causes a difference between the timing A2 and the timing B2 when the level value reaches the maximum value Lmax in the case where the light is intense and the case where the light is weak.

Figure 7:
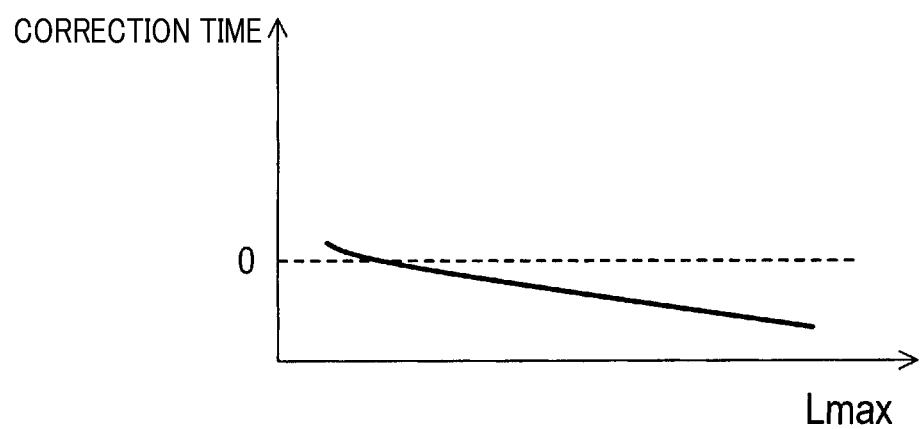
FIG. 7 is a graph showing an example of a map used for correction based on an amount of light.

Accordingly, the amount-of-light corrector 57 according to the embodiment obtains the correction time corresponding to the intensity of light in accordance with a map as shown in FIG. 7. In other words, a map where the correction time decreases with an increase in the maximum value Lmax of the level value is used. This is because an increase in the maximum value Lmax of the level value causes the SPADs 4 to approach saturation before the timing when the amount of the entering light reaches the peak, and this timing shifts toward a shorter-distance side than the original timing when the level value reaches the maximum value Lmax.

The amount-of-light corrector 57 uses, as the time difference ΔT1, a time obtained by adding the correction time corresponding to the intensity of light and the correction time corresponding to the response duration, which is obtained by the response time corrector 56, to correct the timing L when the level value reaches the maximum to approximate the true timing P when the amount of the received light reaches the peak. Specifically, a timing obtained by subtracting the time difference ΔT1 from the timing L when the level value reaches the maximum is identified as the detection timing.

The temporary timing is thus corrected only by ΔT1 to be the true timing by the functions of the response time corrector 56 and the amount-of-light corrector 57, thereby correcting a difference between the irradiation timing and the temporary timing to a difference between the irradiation timing and the true timing.

Figure 8:
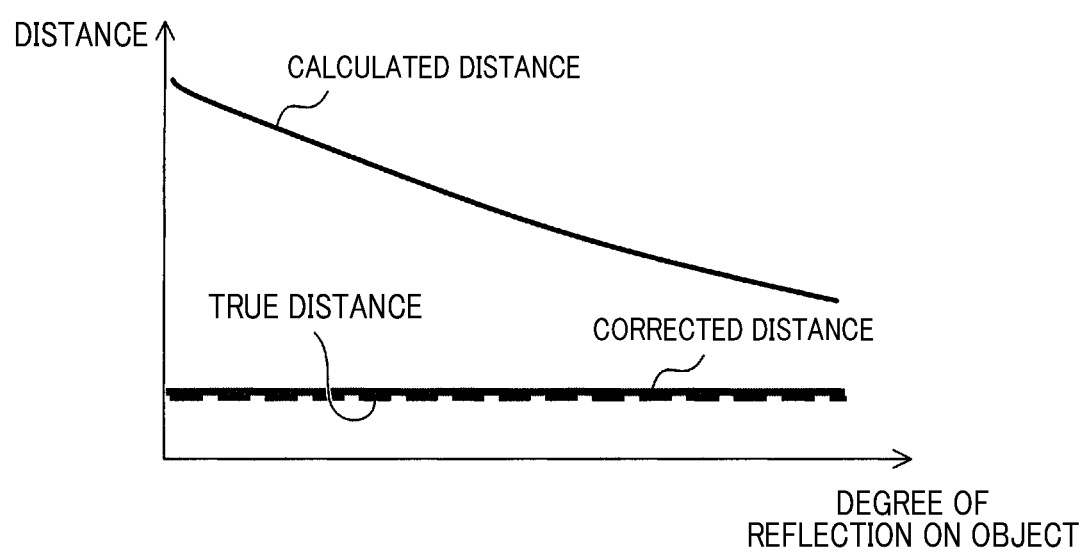
FIG. 8 is a graph showing an example of an effect resulting from distance correction.

Consequently, as shown in FIG. 8, a calculated distance, which is a distance to an object only based on the peak of the level value, is corrected to a corrected distance. The corrected distance is substantially the same as a true distance to the object.

1-3. Effects

The first embodiment described above in detail provides the following effects.

(1a) The above optical distance measurement apparatus 1A includes the plurality of SPADs 4, the plurality of quench resistances 6 and pulse output units 8, the level detection circuits 20, the adder 40, the peak detector 45, the response time corrector 56, and the amount-of-light corrector 57.

The plurality of SPADs 4 are each configured to respond to photon incidence. The plurality of quench resistances 6 and the plurality of pulse output units 8 are each configured to output a pulse signal for each of the plurality of SPADs 4 when the corresponding SPAD 4 responds. The level detection circuits 20 and the adder 40 are configured to detect the response number representing the number of the responding SPADs 4 based on the pulse signal.

The peak detector 45 is configured to identify the temporary timing based on the state of variation in the response number along the time series and identify the detection timing that represents the timing when the optical distance measurement apparatus 1A detects the light in accordance with the temporary timing. The response time corrector 56 and the amount-of-light corrector 57 are configured to acquire the correction time, which represents the time difference between the temporary timing and the true timing corresponding to the distance to the object, and set a timing corrected from the temporary timing by the correction time as the detection timing. Thus, the optical distance measurement apparatus 1A, which identifies the timing obtained by correcting the temporary timing by the correction time as the detection timing, allows for correcting the time difference between the true timing corresponding to the distance to the object and the temporary timing. Consequently, it is possible to accurately estimate the timing when the SPADs 4 detect the light.

(1b) The peak detector 45 of the above optical distance measurement apparatus 1A is configured to identify the timing when the response number reaches the maximum value as the temporary timing.

Thus, the optical distance measurement apparatus 1A, which identifies the timing when the response number reaches the maximum value as the temporary timing, allows for simplifying a process for identifying the temporary timing.

(1c) The amount-of-light corrector 57 of the above optical distance measurement apparatus 1A is configured to calculate the correction time in accordance with the light-receiving environment for the optical distance measurement apparatus 1A.

Thus, the optical distance measurement apparatus 1A, which calculates the correction time in accordance with the light-receiving environment for the optical distance measurement apparatus 1A, allows the correction time to be changed in accordance with a change in the light-receiving environment.

(1d) The response time corrector 56 of the above optical distance measurement apparatus 1A is configured to calculate the correction time by taking into account the response number at the temporary timing and the response duration representing a time period when the responding SPADs 4 continue to respond.

Thus, the optical distance measurement apparatus 1A, which calculates the correction time by taking into account the response number and the response duration, allows for taking into account the amount of light applied to the optical distance measurement apparatus 1A and the characteristics of the SPAD 4. Consequently, it is possible to more accurately estimate the detection timing.

(1e) The amount-of-light corrector 57 of the above optical distance measurement apparatus 1A is configured to calculate the correction time in accordance with the intensity of light entering the optical distance measurement apparatus 1A. Since the SPADs 4 tend to be saturated early if the intensity of the light is high, the correction is made with use of such a tendency.

Thus, the optical distance measurement apparatus 1A, which calculates the correction time in accordance with the intensity of the light entering the optical distance measurement apparatus 1A, it is possible to calculate the correction time in accordance with a change in the temporary timing.

Consequently, it is possible to more accurately estimate the detection timing.

(1f) The level detection circuits 20 of the above optical distance measurement apparatus 1A are each configured as a clock synchronous circuit with a function to identify a pulse signal every time when receiving a clock inputted in a predetermined cycle.

Thus, the optical distance measurement apparatus 1A, which implements the function to identify a pulse signal with use of hardware in the form of a clock synchronous circuit, allows for identifying a pulse signal in a simple manner as compared with a case of using software.

2. Second Embodiment

2-1. Difference from First Embodiment

Since a second embodiment and subsequent embodiments are similar in basic configuration to the first embodiment, differences of the second embodiment and the subsequent embodiments will be described below. It should be noted that the same reference signs as in the first embodiment denote the same components and the preceding descriptions are to be referred to.

In the above first embodiment, the correction time is determined using the maximum value of the level value. In contrast, an optical distance measurement apparatus 1B according to the second embodiment, and as illustrated in FIG. 1, is different from the first embodiment in that the correction time is obtained using an offset value of the level value in addition to the maximum value of the level value.

2-2. Configuration

Figure 9:
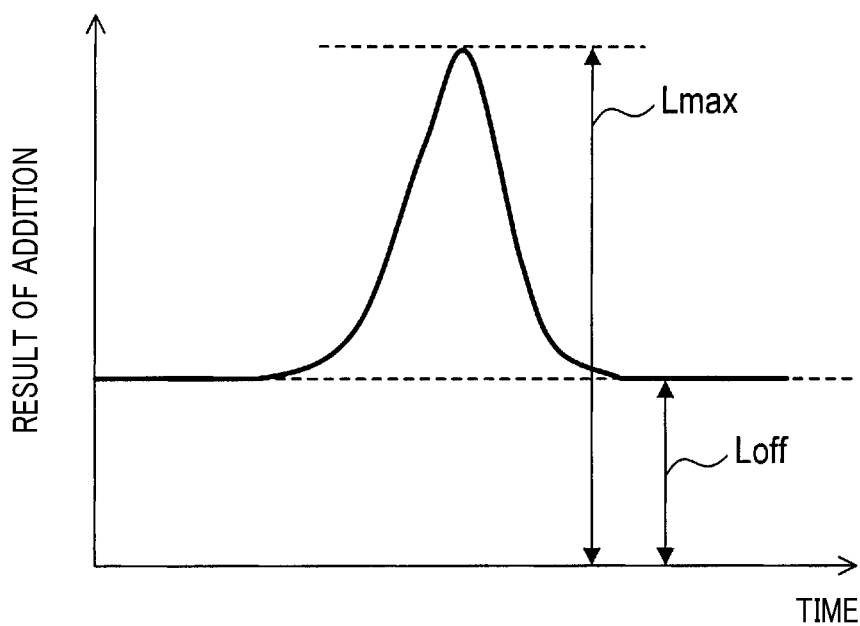
FIG. 9 is a graph showing an example of an offset value for a small amount of ambient light.
Figure 10:
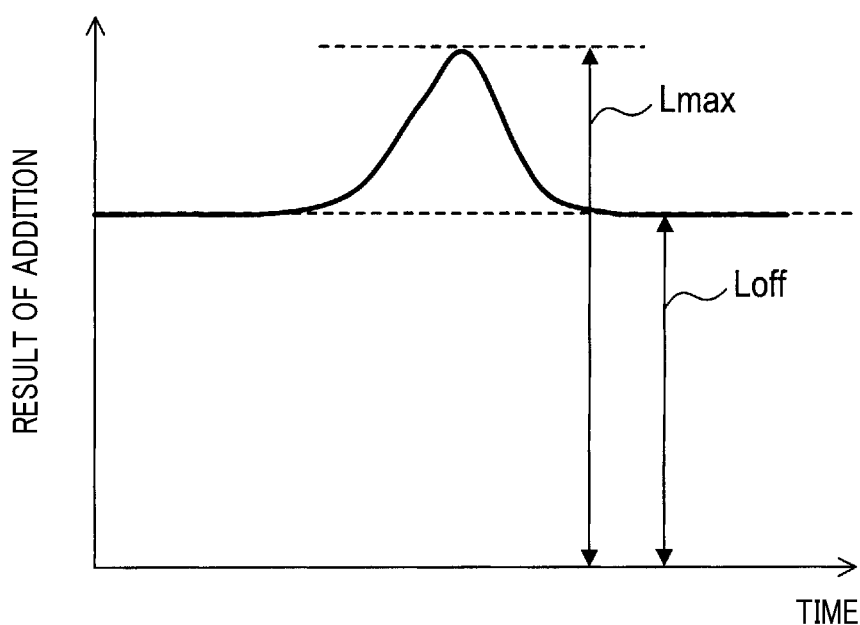
FIG. 10 is a graph showing an example of an offset value for a large amount of ambient light.

The amount-of-light corrector 57 of the optical distance measurement apparatus 1B according to the second embodiment calculates an offset value Loff of the level value in addition to the maximum value Lmax of the level value as shown in FIGS. 9 and 10. The offset value Loff of the level value represents the number of constantly responding ones of the SPADs 4. The light receivers 2 receive light depending on ambient brightness as a disturbance light in addition to a signal light to be received and the disturbance light causes part of the SPADs 4 to respond.

The amount-of-light corrector 57 identifies a value such as an average number or a median number of the SPADs 4 that respond during a period when no signal light is outputted as the number of the constantly responding SPADs 4 and identifies such a value as the offset value Loff.

The offset value Loff increases or decreases depending on an amount of disturbance light. A small amount of disturbance light increases the maximum value Lmax of the level value with respect to the offset value Loff as shown in FIG. 9. In contrast, a large amount of disturbance light reduces the maximum value Lmax of the level value with respect to the offset value Loff as shown in FIG. 10.

Figure 11:
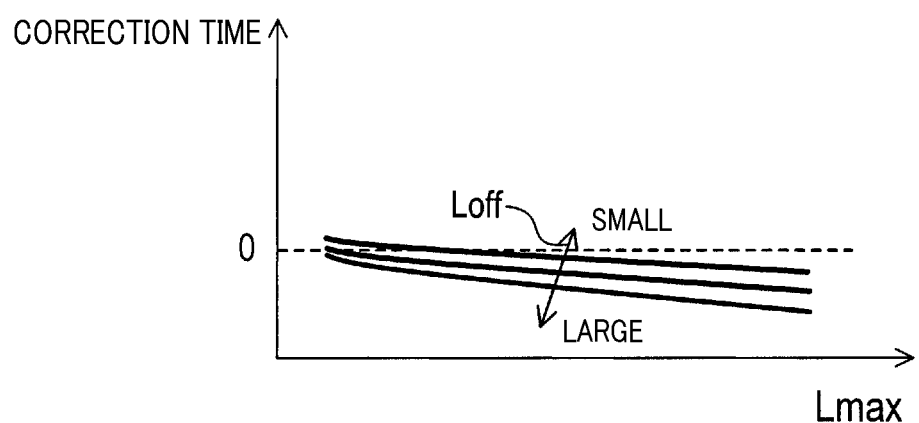
FIG. 11 is a graph showing an example of a map used for correction based on the offset value and the amount of light.

The amount-of-light corrector 57 may set the correction time using a map defined by taking into account not only the maximum value Lmax of the level value but also the offset value Loff as shown in FIG. 11. In this regard, if the offset value Loff accounts for a larger proportion of the maximum value Lmax of the level value, the SPADs 4, which have been close to saturation since before the start of the response caused by the entering light, are likely to reach the peak at an earlier time. Accordingly, the amount-of-light corrector 57 may use a map where the correction time decreases with an increase in the offset value Loff.

2-3. Effects

The second embodiment described above in detail provides the following effect in addition to the effect (1a) of the above first embodiment.

(2a) The response time corrector 56 and the amount-of-light corrector 57 of the above optical distance measurement apparatus 1B are configured to calculate the correction time by taking into account the offset value that represents the number of the constantly responding SPADs 4.

Thus, the optical distance measurement apparatus 1B allows for identifying the intensity of entering light excluding a disturbance light by taking the offset value into account. Consequently, it is possible to correct the detection timing in accordance with the intensity of the entering light.

3. Third Embodiment

3-1. Difference from First Embodiment

In the above first embodiment, the fixed value is used as the correction time for correcting the temporary timing in accordance with the length of the response duration. In contrast, a third embodiment is different from the first embodiment in that the correction time is varied in accordance with the length of the response duration.

3-2. Configuration

Figure 12:
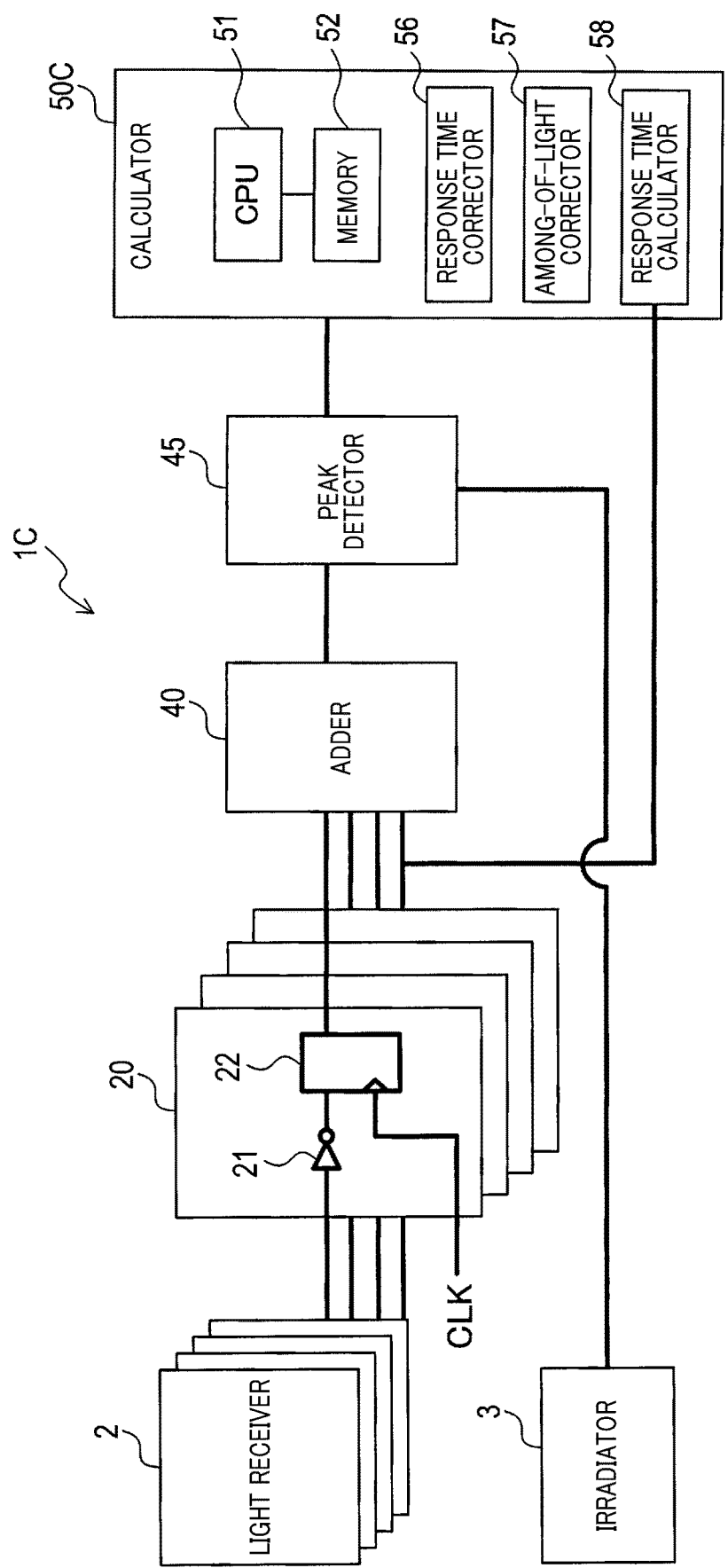
FIG. 12 is a block diagram showing a configuration of an optical distance measurement apparatus according to a third embodiment.

A calculator 50C of an optical distance measurement apparatus 1C according to the third embodiment further includes a response time calculator 58 as a functional component implemented when the CPU 51 executes the program as shown in FIG. 12.

The response time calculator 58 has a function to calculate the correction time in accordance with the light-receiving environment for the optical distance measurement apparatus 1C. In this regard, the above time difference Δ1 tends to increase with an increase in the response duration of the SPADs 4. Accordingly, the response time calculator 58 has a function to vary the correction time in accordance with the response duration of the SPADs 4 among the light-receiving environment.

In more detail, the response time calculator 58 has a function to receive a signal inputted from at least one of the level detection circuits 20, monitoring whether or not the pulse signal is outputted from the level detection circuit 20. The response time calculator 58 then identify the response duration of the SPAD 4 to be monitored by measuring a time period elapsed from the start to the end of the output of the pulse signal.

Figure 13:
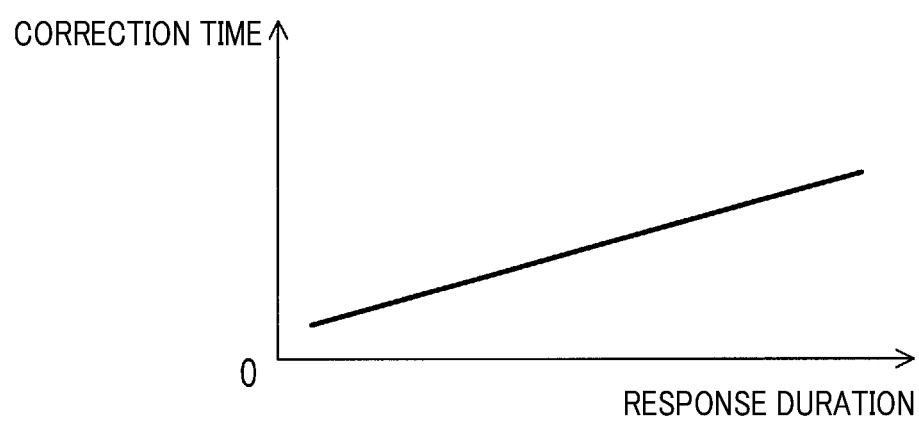
FIG. 13 is a graph showing an example of a map used for correction based on a response duration.

In addition, the response time calculator 58 has a function to set the correction time in accordance with the length of the response duration using a map as shown in FIG. 13. Since an increase in the response duration causes the timing when the level value reaches the maximum value to be accordingly deviated toward a long-distance side, the map shown in FIG. 13 is used, where the correction time increases with an increase in the response duration.

3-3. Effects

The third embodiment described above in detail provides the following effect in addition to the effect (1a) of the above first embodiment.

(3a) The response time calculator 58 of the above optical distance measurement apparatus 1C is configured to calculate the response duration of at least one of the SPADs 4 by monitoring whether or not the SPAD 4 responds. The response time corrector 56 and the amount-of-light corrector 57 are configured to calculate the correction time by taking into account the response duration measured by the response time calculator 58.

Thus, the optical distance measurement apparatus 1C, which actually measures the response duration and obtains the correction time using the response duration, allows for improving correction accuracy. Consequently, it is possible to more accurately estimate the detection timing.

4. Fourth Embodiment

4-1. Difference from Third Embodiment

In the above third embodiment, the response duration is actually measured to determine the correction time. In contrast, a fourth embodiment is different from the third embodiment in that the response duration is estimated taking account of temperature and the correction time is determined using the estimated response duration. It should be noted that the response duration is estimated taking account of temperature in the fourth embodiment because it is known that the response duration of each of the SPADs 4 varies with a change in temperature.

4-2. Configuration

Figure 14:
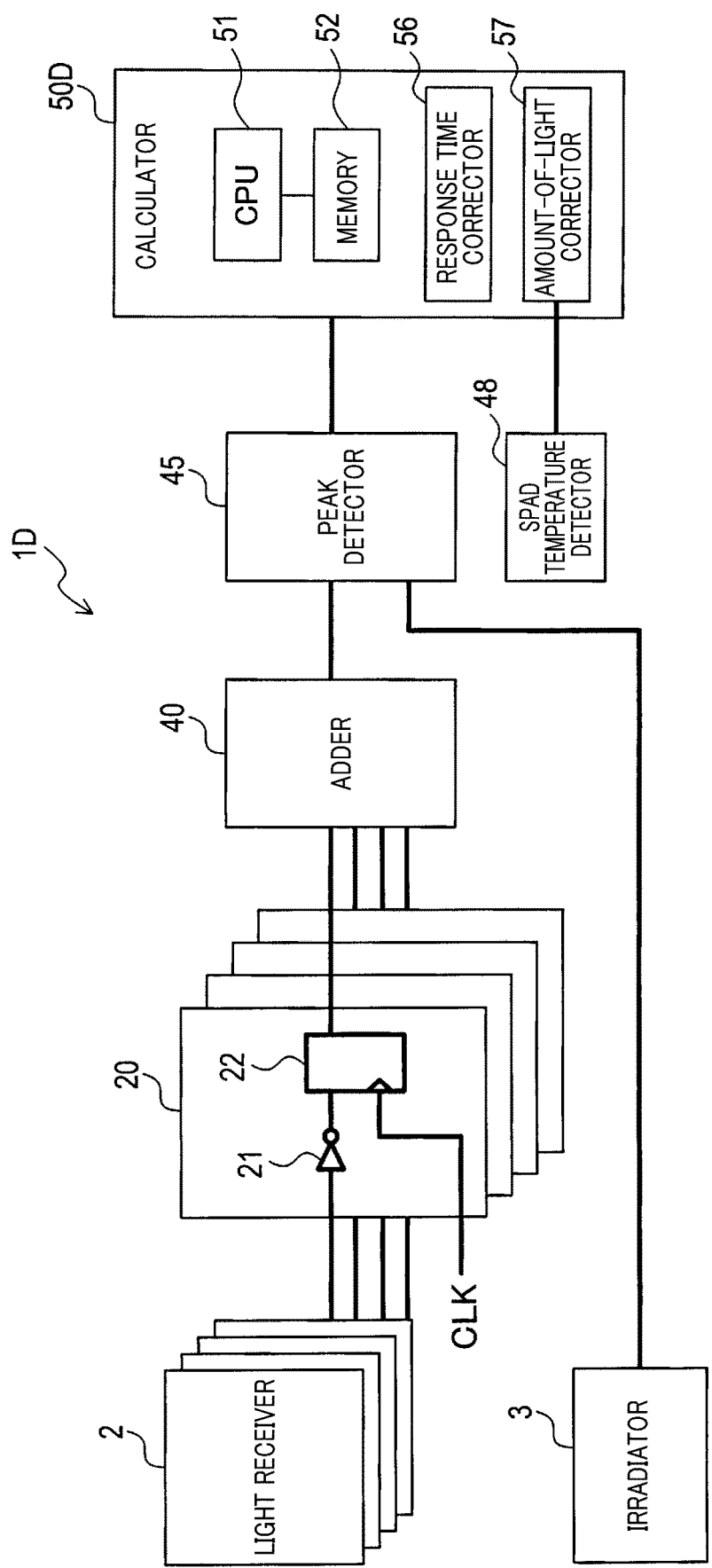
FIG. 14 is a block diagram showing a configuration of an optical distance measurement apparatus according to a fourth embodiment.

An optical distance measurement apparatus 1D according to the fourth embodiment further includes a SPAD temperature detector 48 as shown in FIG. 14. The SPAD temperature detector 48 is configured as a known temperature sensor for detecting a temperature of each of the SPADs 4 or an ambient temperature of each of the SPADs 4. The amount-of-light corrector 57 of a calculator 50D has a function to identify the response duration corresponding to the SPAD temperature detector 48 using an already prepared relational expression or map for identifying a relationship between the SPAD temperature detector 48 and the response duration and calculate the correction time from the above map shown in FIG. 13.

4-3. Effects

The fourth embodiment described above in detail provides the following effect in addition to the effect (1a) of the above first embodiment.

(4a) The SPAD temperature detector 48 of the above optical distance measurement apparatus 1D is configured to acquire the temperature of at least one of the SPADs 4 or the ambient temperature of the SPAD 4. The response time corrector 56 and the amount-of-light corrector 57 are configured to calculate the response duration in accordance with the temperature and calculate the correction time by taking the response duration into account.

Thus, the optical distance measurement apparatus 1D, which acquires the temperature of the SPAD 4 or the ambient temperature of the SPAD 4 and calculates the response duration in accordance with the temperature, allows for improving correction accuracy. Consequently, it is possible to more accurately estimate the detection timing.

5. Fifth Embodiment

5-1. Difference from First Embodiment

In the above first embodiment, the correction time $\Delta T1$ is determined in accordance with the response number of the SPADs 4.

In contrast, a fifth embodiment is different from the first embodiment in that the correction time $\Delta T1$ is determined in accordance with a degree of saturation of the SPADs 4.

5-2. Configuration

Figure 15:
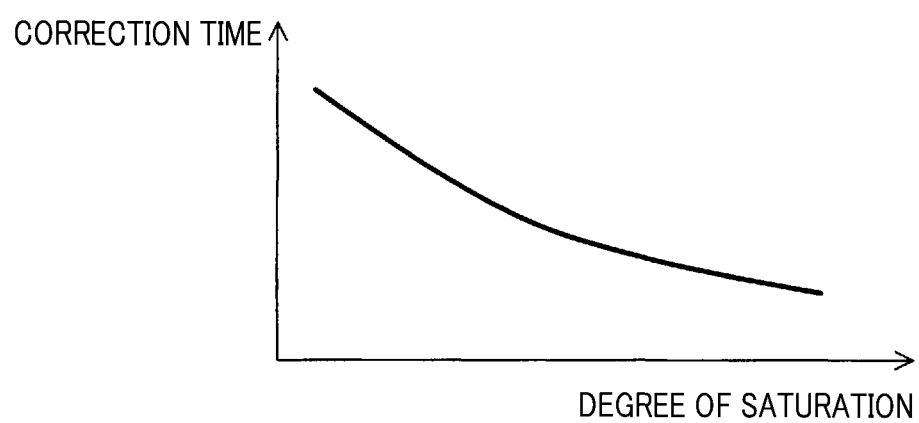
FIG. 15 is a graph showing an example of a map used for correction based on a degree of saturation.

The amount-of-light corrector 57 according to the fifth embodiment determines the correction time $\Delta T1$ in accordance with the degree of saturation of the SPADs 4 as shown in FIG. 15.

The degree of saturation of the SPADs 4 means a ratio of the number of the responding SPADs 4 to the total number of the SPADs 4. For example, in an instance of a timing [C] shown in FIG. 5 where the total number of the SPADs 4 is 16 and the number of the responding SPADs 4 is 15, the degree of saturation is approximately 94%.

A relationship between the degree of saturation of SPADs 4 and the correction time as shown in a graph in FIG. 15 is set to allow the correction time to decrease with an increase in the degree of saturation. Such a tendency shown in the graph is substantially the same as a relationship between the response number of the SPADs 4 and the correction time shown in FIG. 7.

5-3. Effects

The fifth embodiment described above in detail provides the following effect in addition to the effect (1a) of the above first embodiment.

(5a) The amount-of-light corrector 57 according to the fifth embodiment calculates the correction time by taking into account the response ratio relative to the total number of the SPADs 4.

Such a configuration, which takes into account not only the amount of the entering light but also the ratio relative to the number of SPADs, allows for applying a single correction time in accordance with the total number of the SPAD even if a system allows the number of SPADs in pixels to be dramatically changed or a system includes a mixture of pixels different in the number of pixels.

6. Sixth Embodiment

6-1. Difference from First Embodiment

In the above first embodiment, the temporary timing is determined based on the response number of the SPADs 4 resulting from merely a single time of light waves irradiation. In contrast, a sixth embodiment is different from the first embodiment in that the response numbers of the SPADs 4 resulting from a plurality of times of light waves irradiation are accumulated and the temporary timing is determined based on the accumulated value.

6-2. Configuration

The peak detector 45 according to the sixth embodiment identifies a state of variation in the response number along the time series at each time of light waves irradiation by the irradiator 3. For example, for each of any number of times of light waves irradiation including the last irradiation, the peak detector 45 acquires a relationship between a time period elapsed since the light wave irradiation and the response number as data representing the state of variation as shown in FIG. 16. In this case, data representing the state of variation regarding each of the last three times is acquired.

It should be noted that the data representing the previous state of variation is stored in a memory. For example, the data representing the state of variation is stored in the memory 52 of the calculator 50 and acquired from the memory 52.

For the data representing the previous state of variation, the peak detector 45 accumulates the response number per unit of time elapsed since each light wave irradiation, acquiring accumulated data, i.e., accumulated state of variation. The accumulated state of variation is obtained by simple accumulation of the response numbers for the three times as shown in a second drawing from the bottom in FIG. 16.

Subsequently, the peak detector 45 divides the accumulated number by the number of accumulations, i.e., three in this case, and determines a position of a peak from the response number or the degree of saturation based on the divided accumulated state of variation, identifying the temporary timing as described above.

6-3. Effects

The sixth embodiment described above in detail provides the following effect in addition to the effect (1a) of the above first embodiment.

(6a) The peak detector 45 identifies the state of variation in the response number along the time series at each time of light waves irradiated by the irradiator 3 and identifies the temporary timing based on the accumulated state of variation obtained by accumulating the response numbers per unit of time elapsed since each light waves irradiation.

Such a configuration allows for smoothening the response numbers for an improved noise immunity.

7. Other Embodiments

Although the embodiments according to the disclosure have been described above, the disclosure is by no means limited to the above embodiments but may be implemented with various modifications.

(7a) In the above embodiments, although the configuration for determining the correction time is implemented as a software process and the configuration of the peak detector 45 is implemented as hardware, the disclosure is not limited thereto. For example, the configuration for determining the correction time and the configuration of the peak detector 45 may each be implemented as software or hardware or, alternatively, implemented as a combination of software and hardware.

(7b) A plurality of functions of one component in the above embodiments may be implemented by a plurality of components, or one function of one component may be implemented by a plurality of components. Furthermore, a plurality of functions of a plurality of components may be implemented by one component, or one function implemented by a plurality of components may be implemented by one component. Furthermore, a part of the configuration in the above embodiments may be omitted. Furthermore, at least a part of the configuration in any one of the above embodiments may be added to or replaced by the configuration in any other above embodiment. It should be noted that any aspect within the scope of a technical idea understood from the wording in claims provides an embodiment according to the disclosure.

(7c) In addition to the above optical distance measurement apparatuses 1A, 1B, 1C, and 1D, the disclosure may be implemented in a variety of forms such as a system including any one of the above optical distance measurement apparatuses 1A, 1B, 1C, and 1D, a program for enabling a computer to function as a part of any one of the optical distance measurement apparatuses 1A, 1B, 1C, and 1D, a non-transitory substantive recording medium (e.g., a semiconductor memory) storing the program, and a light-detection method.

8. Correspondence Relationship Between Configuration of Embodiment and Configuration of Disclosure The quench resistance 6 and the pulse output unit 8 in the above embodiments correspond to a signal output unit according to the disclosure and the level detection circuit 20 and the adder 40 in the above embodiments correspond to a response number detector according to the disclosure. Additionally, the peak detector 45 in the above embodiments corresponds to a timing identifier according to the disclosure and the SPAD temperature detector 48 in the above embodiments corresponds to a temperature acquirer according to the disclosure.

Additionally, the response time corrector 56 and the amount-of-light corrector 57 in the above embodiments correspond to a timing corrector and a correction calculator according to the disclosure and the response time calculator 58 in the above embodiments corresponds to a response measuring unit according to the disclosure. Additionally, the level detection circuit 70 in the above embodiments corresponds to a clock synchronous circuit according to the disclosure.

What is claimed is:

1. An optical distance measurement apparatus that measures a distance using a round-trip time of light to an object, the apparatus comprising:
    an irradiator configured to irradiate light waves to a region where the object is to be detected;
    a plurality of SPADs each configured to respond to incidence of a photon including a reflected wave of the light waves;

a plurality of signal output units corresponding one-to-one to the plurality of SPADs, the plurality of signal output units being each configured to output a pulse signal every time when corresponding one of the SPADs responds;

a response number detector configured to detect a response number based on the pulse signal, the response number representing a number of the responding SPADs;

a timing identifier configured to identify, based on a state of variation in the response number along a time series, a temporary timing that satisfies conditions where the state of variation is set in advance and identify a detection timing in accordance with the temporary timing, the detection timing representing a timing when the optical distance measurement apparatus detects light;

a timing corrector configured to acquire a correction time representing a time difference between the temporary timing and a true timing corresponding to the distance to the object and set a timing corrected from the temporary timing by the correction time as the detection timing;

a correction calculator configured to calculate the correction time in accordance with a light-receiving environment for the optical distance measurement apparatus, wherein the correction calculator is configured to calculate the correction time by taking into account the response number at the temporary timing and a response duration representing a time period when the responding the SPADs continues to respond; and a response measuring unit configured to monitor whether or not at least one of the SPADs responds to measure the response duration of the SPAD, wherein the correction calculator is configured to calculate the correction time by taking into account the response duration measured by the response measuring unit.

2. The optical distance measurement apparatus according to claim 1, wherein
the timing identifier is configured to identify a timing when the response number reaches a maximum value as the temporary timing.

3. The optical distance measurement apparatus according to claim 1, wherein
the correction calculator is configured to calculate the correction time in accordance with an intensity of light entering the optical distance measurement apparatus.

4. The optical distance measurement apparatus according to claim 1, wherein
the correction calculator is configured to calculate the correction time by taking into account a response ratio relative to a total number of the SPADs.

5. The optical distance measurement apparatus according to claim 1, wherein
the correction calculator is configured to calculate the correction time by taking into account an offset value representing the number of constantly responding SPADs.

6. The optical distance measurement apparatus according to claim 1, wherein
the timing identifier is configured to identify the state of variation in the response number along the time series when the irradiator irradiates the light waves and identify the temporary timing based on an accumulated state of variation defined by accumulating the response number per unit of time from every irradiation of the light waves.

7. An optical distance measurement apparatus that measures a distance using a round-trip time of light to an object, the apparatus comprising:
an irradiator configured to irradiate light waves to a region where the object is to be detected;
a plurality of SPADs each configured to respond to incidence of a photon including a reflected wave of the light waves;
a plurality of signal output units corresponding one-to-one to the plurality of SPADs, the plurality of signal output units being each configured to output a pulse signal every time when corresponding one of the SPADs responds;
a response number detector configured to detect a response number based on the pulse signal, the response number representing a number of the responding SPADs;
a timing identifier configured to identify, based on a state of variation in the response number along a time series, a temporary timing that satisfies conditions where the state of variation is set in advance and identify a detection timing in accordance with the temporary timing, the detection timing representing a timing when the optical distance measurement apparatus detects light;
a timing corrector configured to acquire a correction time representing a time difference between the temporary timing and a true timing corresponding to the distance to the object and set a timing corrected from the temporary timing by the correction time as the detection timing; and
a correction calculator configured to calculate the correction time in accordance with a light-receiving environment for the optical distance measurement apparatus, wherein the correction calculator is configured to calculate the correction time by taking into account the response number at the temporary timing and a response duration representing a time period when the responding the SPADs continues to respond; and
a temperature acquirer configured to acquire a temperature of at least one of the SPADs or an ambient temperature of the SPAD, wherein the correction calculator is configured to calculate the response duration in accordance with the temperature and calculate the correction time by taking the response duration into account.

8. The optical distance measurement apparatus according to claim 7, wherein
the timing identifier is configured to identify a timing when the response number reaches a maximum value as the temporary timing.

9. The optical distance measurement apparatus according to claim 7, wherein
the correction calculator is configured to calculate the correction time in accordance with an intensity of light entering the optical distance measurement apparatus.

10. The optical distance measurement apparatus according to claim 7, wherein
the correction calculator is configured to calculate the correction time by taking into account a response ratio relative to a total number of the SPADs.

11. The optical distance measurement apparatus according to claim 7, wherein
the correction calculator is configured to calculate the correction time by taking into account an offset value representing the number of constantly responding SPADs.

12. The optical distance measurement apparatus according to claim 7, wherein
the timing identifier is configured to identify the state of variation in the response number along the time series when the irradiator irradiates the light waves and identify the temporary timing based on an accumulated state of variation defined by accumulating the response number per unit of time from every irradiation of the light waves.

* * * * *